United States Patent [19]

Kamada

[11] Patent Number: 4,518,449
[45] Date of Patent: May 21, 1985

[54] PROCESS FOR PRODUCTION OF HYDRATE SURFACED ROLLED COPPER FOIL LAMINATED PLATES

[75] Inventor: Osao Kamada, Tokyo, Japan

[73] Assignee: Hitachi Cable Limited, Tokyo, Japan

[21] Appl. No.: 617,439

[22] Filed: Jun. 5, 1984

[30] Foreign Application Priority Data

Oct. 27, 1983 [JP] Japan ................ 58-201685

[51] Int. Cl.³ .............................. B32B 31/12
[52] U.S. Cl. ................... 156/153; 29/459;
148/6.14 R; 156/629; 156/645; 156/666;
428/628; 428/639; 428/675
[58] Field of Search ............ 29/458, 459; 72/46;
148/6.14 R, 6.31; 156/153, 629, 645, 666;
428/628, 629, 632, 639, 675

[56] References Cited

U.S. PATENT DOCUMENTS 3,342,647  9/1967  Coe ......................... 148/6.14 R
3,434,889  3/1969  Haroldson et al. ........ 148/6.14 R
3,544,389  12/1970 Vazirani .................... 148/6.14 R
4,292,095  9/1981  Schlinsog ..................... 72/46 X
4,409,037  10/1983 Landau ..................... 148/6.14 R
4,428,987  1/1984  Bell et al. ............... 148/6.14 R X
4,434,022  2/1984  Kamada et al. ............ 156/274.6

Primary Examiner—Robert A. Dawson
Attorney, Agent, or Firm—Sughrue Mion Zinn Macpeak & Seas

[57] ABSTRACT

A process for producing cooper foil laminated plates using rolled copper foils made of oxygen-free copper is described. The major feature of the present process is that in laminating a rolled copper foil on an insulating substrate, the rolled copper foil is ground or abraded and immediately brought into contact with water or steam to form a hydrate layer on the surface thereof. This hydrate layer increases the adhesion strength of the rolled copper foil to the insulating substrate through an adhesive, producing a copper foil laminated plate having an adhesion strength sufficiently high for practical use. Thus these copper foil laminated plates are very suitable for use in wiring of electronic devices.

8 Claims, 2 Drawing Figures

PROCESS FOR PRODUCTION OF HYDRATE SURFACED ROLLED COPPER FOIL LAMINATED PLATES

BACKGROUND OF THE INVENTION

The present invention relates to a process for the production of copper foil laminated plates. More particularly, the invention relates to a process for producing copper foil laminated plates using rolled copper foils made of oxygen-free copper with an oxygen content of not more than 50 ppm. These copper foil laminated plates are indispensable to electronic devices for the purpose of wiring.

A copper foil laminated plate for use in wiring of electronic devices basically is composed of an insulating hard or soft plastic substrate and a copper foil of a desired thickness bonded firmly to one or both sides of the plastic substrate by the use of a suitable adhesive.

In the production of conventional copper foil laminated plates, a so-called electrolytic copper foil produced by electrolytic deposition of a copper ion-containing solution has commonly been used as the copper foil. In general, however, adhesion between copper and plastics is inherently poor. Thus, in the case of electrolytic copper foils, a special surface treatment has been applied to the surface thereof to provide a very coarse surface structure. That is, the surface of electrolytic copper foil having fine irregulaties resulting from growth of copper crystals in the process of electrolytic deposition is further subjected to anodic oxidation to form a copper suboxide layer, in some cases a copper oxide layer, with a thickness of about several microns. The coarse surface structure increases the adhesion strength between the electrolytic copper foil and the adhesive. This results in an increase in the adhesion strength of the copper foil laminated plate as a whole.

Two problems have been encountered in producing copper foils for use in the conventional copper foil-laminated plates: one is the difficulty of disposal of waste liquids from electrolytic deposition and anodic oxidation, and the other is that production costs are very high because the efficiency of electrochemical operations is poor.

As a result of extensive studies on high frequency transmission characteristics such as the tone quality of audio devices and resonance characteristics of TV video circuits, it has been found that copper suboxide or copper oxide formed on the surface of the copper foil for the purpose of increasing the adhesion strength exerts seriously large adverse influences on the high frequency response of such foil.

Moreover, when a circuit pattern is formed in the copper foil laminated plate by etching, copper suboxide or copper oxide particles remain in the insulating substrate embedded therein, even after the formation of the circuit. Thus the circuit is not suitable for practical use unless a strong etchant is applied to remove the copper suboxide or copper oxide particles. Application of such a strong etchant, however, undesirably causes so-called side etching. It is therefore not possible to reduce the circuit conductor spacings below a certain level when the conventional electrolytic copper foil made coarse by oxidation is used.

SUMMARY OF THE INVENTION

An object of the invention is to provide a process for the production of copper foil laminated plates in which the adhesion strength between the copper foil and an insulating substrate is satisfactory.

Another object of the invention is to provide a process for the production of copper foil laminated plates using rolled copper foils in place of electrolytic copper foils.

In accordance with the above objects, the present invention provides a process of producing a copper foil laminated plate composed of a rolled copper foil and an insulating substrate, which process comprises the steps of:

(a) cleaning the surface of the rolled copper foil;
(b) grinding or abrading the cleaned surface to activate it;
(c) bringing the ground or abraded surface into contact with water or steam to form a strong hydrate layer thereon;
(d) coating the surface with the hydrate layer formed thereon with an adhesive capable of forming a bond, physical or chemical, with a —OH group;
(e) precuring the coated adhesive; and
(f) placing an insulating substrate on the adjesive-coated surface of the rolled copper foil and heating them to combine together the insulating substrate and the rolled copper foil, whereby the desired copper foil laminated plate is obtained.

BRIEF DESCRIPTION OF THE DRAWINGS

Drawings are provided which illustrate the mechanism of adhesion in the process of the present invention, of which.

DESCRIPTION OF THE PREFERRED EMBODIMENTS

Figure 1:
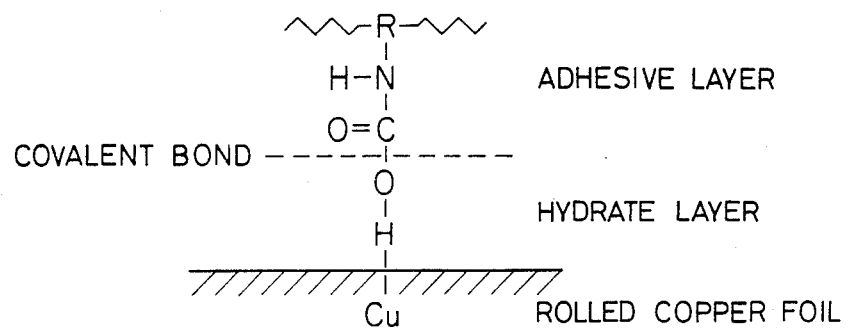
FIG. 1 is a view illustrating the mechanism of adhesion between an adhesive containing an isocyanate group and a rolled copper foil.

In the process of the present invention, a copper foil manufactured by rolling is used as the copper foil for use in copper foil laminated plates in place of the above-described electrolytic copper foil. Specifically, a rolled copper foil made of oxygen-free copper having an oxygen content of not more than 50 ppm, preferably not more than 10 ppm, is used in view of its superiority in high frequency response, particularly, its response characteristics for use in audio devices and its resonance characteristics for use in TV video circuits. However, the surface of such rolled copper foils is very smooth and chemically stable (inactive). As such, the adhesion strength to the insulating substrate is seriously low.

It has been found that copper foil laminated plates having a very high adhesion strength can be produced by employing the process of the invention, which includes steps of (a) cleaning the surface of a rolled copper foil, (b) grinding or abrading the above-cleaned surface to activate it, (c) bringing the above-ground or abraded surface into contact with water or steam to form a strong hydrate layer thereon, (d) coating the surface with the hydrate layer formed thereon with an adhesive capable of forming a bond, physical or chemical, with a —OH group, (e) precuring the coated adhesive, and (f) placing an insulating substrate on the adhesive-coated surface of the rolled copper foil and heating them to combine together the insulating substrate and the rolled copper foil.

In general, when the surface of a metal is ground or abraded, the crystal structure of the metal is broken and free electrons are released from the surface thereof, realizing for a limited time a state in which metal ions are present on the surface.

The metal surface in the state is very reactive and readily bonds to many chemical substances. Therefore, moisture and oxygen in the air are adsorbed on the metal surface immediately after the realization of the above-described surface state, resulting in the formation of a hydrate layer and a oxidized layer on the surface. The spontaneously formed hydrate layer coexists with the oxide and its adhesion to the mother metal material is poor. Thus, no adhesion of sufficiently high strength can be attained even if an adhesive is coated on the surface in the above-described state.

For this reason, in order to form a strong hydrate layer on the metal surface, it is necessary that the influences of oxygen be minimized and adsorption of water alone be achieved.

In accordance with the process of the present invention, a rolled copper foil is first soaked in, for example, an alkaline aqueous solution composed mainly of caustic soda or caustic potash, a trichloroethylene solvent, a perchloroethylene solvent, a trichloroethane solvent, or a tetrafluoroethylene solvent to remove oil, etc. adhering to the surface thereof.

The thus-cleaned rolled copper foil surface is then activated by grinding or abrading by means of, for example, sandblasting or the use of a rotary brush or a whetstone.

Immediately after this activation, the rolled copper foil is placed in boiling water not containing impurities such as metal ions, or in an atmosphere of impurity-free steam, whereupon water molecules are adsorbed, physically and chemically, on the surface of the rolled copper foil, forming a hydrate layer several to several dozen molecules in thickness. That is, chemically active hydroxyl groups are distributed on the surface of the rolled copper foil. Thus, when an adhesive capable of bonding, physically or chemically, to the hydroxyl group is coated on the rolled copper foil and precured, it firmly bonds to the surface of the rolled copper foil.

Adhesives which can be used are those containing, for example, an epoxy group, an amide group, an isocyante group, and a carboxyl group. The present invention is not limited to these and any adhesive can be used as long as it is active to the —OH group. The adhesion force is considered to be obtained by the hydrogen bond between the polar group of the adhesive and the —OH group of the hydrate layer.

Figure 2:
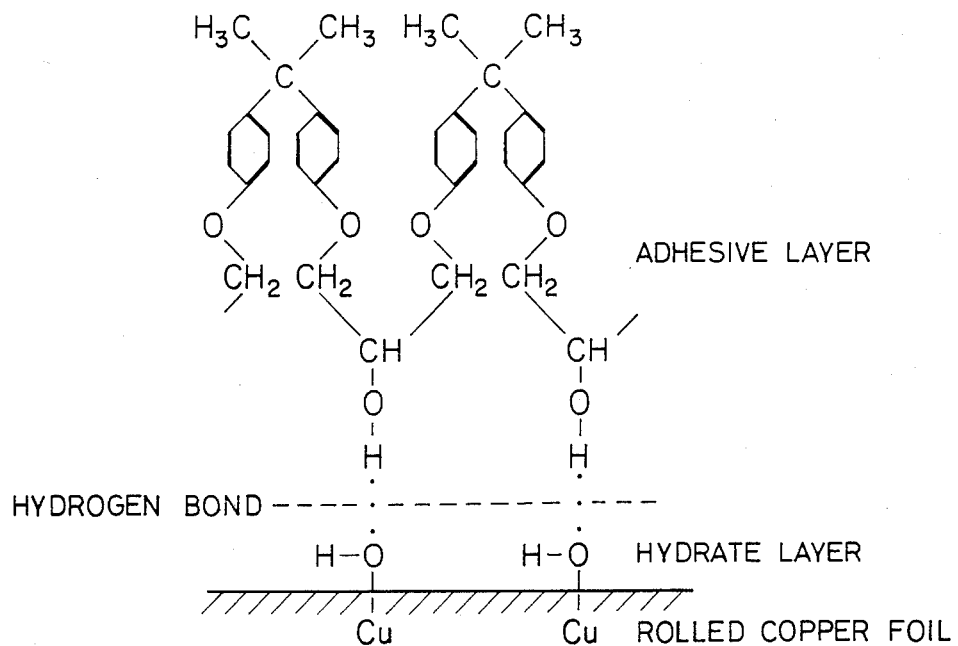
FIG. 2 is a view illustrating the mechanism of adhesion between an adhesive containing an epoxy group and a rolled copper foil.

FIG. 1 illustrates the mechanism of adhesion between an adhesive containing isocyanate groups and rolled copper foil, and FIG. 2 the mechanism of adhesion between an adhesive containing epoxy groups and a rolled copper foil. The hydrate layer formed on the surface of the rolled copper foil and the adhesive layer are bonded together firmly by primary bonds including covalent bonds or hydrogen bonds. This has been found to produce an unexpectedly good adhesion effect.

On the rolled copper foil on the surface of which the adhesive layer has been provided is placed an insulating substrate, and the two are pressed together at a predetermined temperature for a predetermined time, whereupon a very strong copper foil laminated plate is obtained.

Insulating substrates which can be used include a substrate fabricated by impregnating a paper substrate with a phenol resin or an epoxy resin and then precuring the resin, a substrate fabricated by impregnating a glass cloth substrate with an epoxy resin and then precuring the resin, and a substrate fabricated by impregnating a glass cloth with polytetrafluoroethylene and then sintering. In addition, films of a polyester rein and a polyimide resin can be used.

In laminating the rolled copper foil and the insulating substrate, it is essential for a heat-pressing procedure to be applied at 100° to 180° C. to accelerate the hardening of the adhesive. At this stage, the rolled copper foil is oxidized, causing undesirable discoloration. For this reason, it is preferred to provide an anticorrosive layer on the surface of the rolled copper foil. This anticorrosive layer can be formed by providing a very thin film of chromium alone or combinations of chromium and heavy metal elements such as zinc and nickel, i.e., by applying a so-called chromating treatment.

In the process of the present invention, the anticorrosive layer can be formed simultaneously with the hydrate layer. That is, rolled copper foil, the surface of which has been ground or abraded, is dipped in an aqueous solution containing at least one of $CrO_3$, $K_2CrO_3$, $Na_2Cr_2O_7$, etc., and thereafter washed with water and dried, whereby chromium is chemically plated on the surface of the rolled copper foil and water ($H_2O$) attaches to the chromium layer through primary bonding, forming —OH terminals.

The above-described aqueous solution may further contain heavy metal compounds such as $ZnO$, $ZnSO_4.7H_2O$, $ZnCO_3$ and $CoCO_3$. Of these compounds, zinc compounds are especially preferred.

The present invention will be described in greater detail with reference to the following Examples and Comparative Examples.

EXAMPLE 1

A 37 μm thick rolled copper foil made of oxygen-free copper was cleaned with a trichloroethylene solvent. One side of the rolled copper foil was ground by means of a high-speed rotary steel brush at 1500 rpm to provide a 35 μm thick copper foil.

Immediately after this grinding operation, the rolled copper foil was dipped in distilled water maintained at 100° C. for 10 minutes and then dried in a nitrogen gas atmosphere at 110° C. for 3 minutes.

On the thus-treated side of the rolled copper foil was coated an adhesive having a composition as shown in Table 1 to a thickness of 25 to 30 μm. The adhesive was then precured at 160° C. for 5 minutes. Thereafter, the rolled copper foil was placed on a NEMA-FR 4 glass-/epoxy prepreg insulating substrate in such a manner that the adhesive-coated side was in contact with the substrate. They were heated and pressed for 1 hour at 175° C. under a pressure of 50 kg/cm² to produce a copper foil laminated plate.

COMPARATIVE EXAMPLE 1

In this example, a rolled copper foil of the same thickness as in Example 1 was used. This rolled copper foil was cleaned with a trichloroethylene solvent. An adhesive having the composition shown in Table 1 was coated on the rolled copper foil to a thickness of 25 to 30 μm without application of a surface-grinding operation. Thereafter, the same procedure as in Example 1 was repeated to produce a copper foil laminated plate.

The copper foil laminated plates produced in Example 1 and Comparative Example 1 were measured with respect to the peeling strength of the rolled copper foil from the insulating substrate. The results are shown in Table 2 below:

TABLE 1

| | Amount (parts by weight) |
|---|---|
| 6/6.6/6.10 copolymerization nylon | 55 |
| Bisphenol A-type epoxy resin | 45 |
| Dicyandiamide | 4.5 |
| Cuprous chloride | 0.05 |
| Irganox MI1024* | 0.2 |
| Methanol/trichloroethylene (50:50) | 300 |

*Trade name for a product manufactured by Ciba Geigy Co.

TABLE 2

| | Peeling Strength (kg/cm) |
|---|---|
| Example 1 | 2.8 |
| Comparative Example 1 | 0.38 |

EXAMPLE 2

In this example, a rolled copper foil of the same thickness as in Example 1 was used. This rolled copper foil was ground, coated with an adhesive, and precured in the same manner and under the same conditions as in Example 1.

A 0.8 mm thick glass/Teflon TM substrate was fabricated by impregnating a glass fabric with polytetrafluoroethylene (Teflon TM TFE) and then sintering. The surface of the glass fabric had been subjected to an ething treatment using a metallic sodium suspension for 10 seconds.

This insulating substrate was placed on the adhesive-coated side of the rolled copper foil, and the two were then heat-pressed at a temperature of 170° C. under a pressure of 30 kg/cm for 1 hour to produce a copper foil laminated plate.

COMPARATIVE EXAMPLE 2

A copper foil laminated plate was produced in the same manner and under the same conditions as in Example 2 except that the surface-grinding operation was omitted.

The copper foil laminated plates produced in Example 2 and Comparative Example 2 were measured for the peeling strength of the rolled copper foil from the insulating substrate. The results are shown in Table 3 below.

TABLE 3

| | Example 2 | Comparative Example 2 |
|---|---|---|
| Peeling Strength (ordinary temperature) (kg/cm) | 2.20 | 0.33 |
| Peeling Strength (After soaking in solder bath at 260° C. for 20 seconds) (kg/cm) | 2.45 | 0.40 |
| Change in appearance when soaked in solder bath at 260° C. | No Change observed 60 seconds. | Swelling occurred in 18 seconds. |
| High Temperature Peeling Strength (120° C.) (kg/cm$^2$) | 1.63 | 0.1 or less |

EXAMPLE 3

A 35 μm thick rolled copper foil made of oxygen-free copper was cleaned with a trichloroethylene solvent. One side of the rolled copper foil was abraded three times with a high-speed rotary nylon brush with abrasion powder at 1000 rpm.

Immediately after this abrading operation, the rolled copper foil was dipped in distilled water at 100° C. for 2 minutes and then dried in a nitrogen gas atmosphere at 110° C. for 3 minutes.

On the thus-treated side of the rolled copper foil was coated an adhesive having the composition shown in Table 4 to a thickness of 25 to 30 μm, and the adhesive was then precured at 120° C. for 10 minutes. Thereafter, the rolled copper foil was placed on a NEMAG-10 epoxy prepreg insulating substrate (thickness of 1.6 mm) in such a manner that the adhesive-coated side was in contact with the substrate. The two were heat pressed at a temperature of 180° C. under a pressure of 40 kg/cm for 1 hour to produce a copper foil laminated plate.

COMPARATIVE EXAMPLE 3

In this example, a rolled copper foil of the same thickness as in Example 3 was used. This rolled copper foil was cleaned with a trichloroethylene solvent. An adhesive having the composition shown in Table 4 was coated on the rolled copper foil to a thickness of 25 to 30 μm without application of a surface-grinding operation. Thereafer, the same procedure as in Example 1 was repeated to produce a copper foil laminated plate.

The copper foil laminated plates produced in Example 3 and Comparative Example 3 were tested for the peeling strength of the rolled copper foil from the insulating substrate. The results are shown in Table 5.

TABLE 4

| | Amount (parts by weight) |
|---|---|
| Diglycidyl ether/bisphenol type epoxy resin | 100 |
| Hykar CTBN-X* | 35 |
| Hydroxy group-terminated urethane prepolymer | 10 |
| Dicyandiamide | 10 |
| Irganox MD-1024 | 0.3 |
| Methanol/trichloroethylene (50:50) | 300 |

*Trade name for a product manufactured by BF Goodrich Co.

TABLE 5

| | Example 3 | Comparative Example 3 |
|---|---|---|
| Peeling Strength (ordinary temperature) (kg/cm) | 1.88 | 0.25 |
| Peeling Strength (after soaking in solder bath at 260° for 20 second) (kg/cm) | 1.60 | 0.18 |

EXAMPLE 4

A 37 μm thick rolled copper foil made of oxygen-free copper was cleaned with a trichloroethylene solvent. One side of the rolled copper foil was ground with a high-speed rotary steel brush at 1500 rpm to form a 35 μm thick copper foil.

Immediately after this grinding operation, the rolled copper foil was soaked in an aqueous solution (temperature of 80° C.) containing 10% anhydrous chromic acid ($CrO_3$) and 10% sulfuric acid for 2 minutes, fully washed with water, and then dried in a nitrogen gas atmosphere at 110° C. for 3 minutes.

An adhesive having the composition shown in Table 1 was coated on the above-treated side of the rolled copper foil to a thickness of 25 μm and precured at 160° C. for 5 minutes.

Subsequently, the same insulating substrate as used in Example 2 was placed on the adhesive-coated side of the rolled copper foil, and the two were processed in the same manner and under the same conditions as in Example 2 to produce a copper foil laminated plate.

The copper foil laminated plate produced in Example 4 was measured for adhesion characteristics. The results are shown in Table 6.

No discoloration was observed in the rolled copper foil, even if heated in air at 180° C. for 10 minutes.

TABLE 6

| | Example 4 |
|---|---|
| Peeling Strength (ordinary temperature) (kg/cm) | 2.04 |
| Peeling Strength (after soaking in solder bath at 260° C. for 20 seconds) (kg/cm) | 2.18 |
| Change in appearance after | No change for 60 seconds |
| High Temperature Peeling Strength (120° C.) (kg/cm) | 1.55 |

The present invention, as described above, permits production of copper foil laminated plates having a sufficiently high adhesion strength for practical use, even when inexpensive rolled copper foil is used.

Furthermore, copper foil laminated plates produced by the process of the present invention are free of copper suboxide or copper oxide particles which remain embedded in conventional copper foil laminated plates when an etching treatment is applied to form circuit patterns. Thus, the time required for the etching treatment is shortened and, moreover, the distances between adjacent patterns can be reduced.

The copper foil laminated plates produced by the process of the present invention have superior high frequency characteristics due to the excellent characteristics of the rolled copper foils.

Discoloration due to oxidation of copper foil at the heat-pressing stage can be prevented by applying a chromate treatment to the surface of rolled copper foils.

I claim:

1. A process for producing a copper foil laminated plate comprising a rolled copper foil and an insulating substrate, which process comprises the steps of:
   (a) cleaning the surface of the rolled copper foil;
   (b) grinding or abrading the above-cleaned surface to activate it;
   (c) bringing the above-treated surface into contact with water or steam to form a strong hydrate layer on the surface;
   (d) coating the surface with the hydrate layer formed thereon with an adhesive capable of bonding, physically or chemically to a —OH group;
   (e) precuring the above-coated adhesive; and
   (f) placing the insulating substrate on the adhesive-coated side of the rolled copper foil and heat-pressing the insulating substrate and foil.

2. The process as claimed in claim 1, wherein the rolled copper foil is made of oxygen-free copper having an oxygen content of not more than 50 ppm.

3. The process as claimed in claim 1, wherein cleaning of the rolled copper foil is performed by soaking it in an alkali aqueous solution, a trichloroethylene solvent, a perchloroethylene solvent, a perchloroethylene solvent, a trichloroethane solvent, or a tetrafluoroethylene solvent.

4. The prcoess as claimed in claim 1, wherein the grinding or abrading of the surface of the rolled copper foil is performed by sandlasting or with the use of a rotary brush or a rotary whetstone.

5. The process as claimed in claim 1, where the formation of the hydrate layer is performed in boiling distilled water.

6. The process as claimed in claim 1, wherein the formation of the hydrate layer is performed in an aquous solution containing at least one of chromic acide and a chromic acid salt.

7. The process as claimed in claim 1, wherein the formation of the hydrate layer is performed in an aqueous solution containing at least one of chromic acid and a chromic acid salt, and a heavy metal compound.

8. The process as claimed in claim 7, wherein the heavy metal compound is a zinc compound.

* * * * *